(12) United States Patent
Giusti et al.

(10) Patent No.: US 11,614,634 B2
(45) Date of Patent: Mar. 28, 2023

(54) PIEZOELECTRIC MEMS ACTUATOR FOR COMPENSATING UNWANTED MOVEMENTS AND MANUFACTURING PROCESS THEREOF

(71) Applicant: STMicroelectronics S.r.l., Agrate Brianza (IT)

(72) Inventors: Domenico Giusti, Caponago (IT); Dario Paci, Vittuone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 425 days.

(21) Appl. No.: 16/880,141

(22) Filed: May 21, 2020

(65) Prior Publication Data
US 2020/0371376 A1 Nov. 26, 2020

(51) Int. Cl.
| | |
|---|---|
| *G02B 27/64* | (2006.01) |
| *G03B 5/06* | (2021.01) |
| *H02N 2/02* | (2006.01) |
| *H02N 2/00* | (2006.01) |

(Continued)

(52) U.S. Cl.
CPC .......... *G02B 27/646* (2013.01); *B81B 3/0021* (2013.01); *G03B 5/06* (2013.01);
(Continued)

(58) Field of Classification Search
CPC .. G02B 27/646; G02B 26/0858; G02B 7/023; G02B 26/0875; B81B 3/0021;
(Continued)

(56) References Cited

U.S. PATENT DOCUMENTS

| 7,420,318 B1 * | 9/2008 | Pulskamp | ............ H01L 41/096 |
|---|---|---|---|
| | | | 310/311 |
| 7,482,730 B2 * | 1/2009 | Davis | ................. G02B 26/0833 |
| | | | 310/333 |

(Continued)

FOREIGN PATENT DOCUMENTS

| EP | 2270972 A1 | 1/2011 |
|---|---|---|
| EP | 3096367 A1 | 11/2016 |
| WO | 2012003529 A1 | 1/2012 |

OTHER PUBLICATIONS

IT Search Report and Written Opinion for IT Appl. No. 102019000007219 dated Feb. 6, 2020 (8 pages).

(Continued)

*Primary Examiner* — John K Kim
(74) *Attorney, Agent, or Firm* — Crowe & Dunlevy

(57) ABSTRACT

A MEMS actuator includes a monolithic body of semiconductor material, with a supporting portion of semiconductor material, orientable with respect to a first and second rotation axes, transverse to each other. A first frame of semiconductor material is coupled to the supporting portion through first deformable elements configured to control a rotation of the supporting portion about the first rotation axis. A second frame of semiconductor material is coupled to the first frame by second deformable elements, which are coupled between the first and the second frames and configured to control a rotation of the supporting portion about the second rotation axis. The first and second deformable elements carry respective piezoelectric actuation elements.

12 Claims, 13 Drawing Sheets

(51) Int. Cl.
  *B81B 3/00* (2006.01)
  *H01L 41/22* (2013.01)
  *H01L 41/09* (2006.01)
(52) U.S. Cl.
  CPC .......... *H01L 41/0953* (2013.01); *H01L 41/22* (2013.01); *H02N 2/028* (2013.01); *H02N 2/22* (2013.01); *B81B 2201/032* (2013.01); *B81B 2201/047* (2013.01); *B81B 2203/053* (2013.01); *B81B 2203/058* (2013.01); *G03B 2205/0023* (2013.01)
(58) Field of Classification Search
  CPC ........ B81B 2201/032; B81B 2201/047; B81B 2203/053; B81B 2203/058; B81B 7/02; G03B 5/06; G03B 2205/0023; H01L 41/0953; H01L 41/22; H02N 2/028; H02N 2/22; B81C 1/0015; B81C 2201/0163
  USPC .................................................. 310/311, 328
  See application file for complete search history.

(56) References Cited

U.S. PATENT DOCUMENTS

| | | | | |
|---|---|---|---|---|
| 7,605,966 | B2* | 10/2009 | Tani | G02B 26/0858 |
| | | | | 359/224.1 |
| 9,306,475 | B1* | 4/2016 | Ba-Tis | H02N 1/006 |
| 2011/0032590 | A1 | 2/2011 | Terada et al. | |
| 2012/0320439 | A1* | 12/2012 | Hiraoka | G02B 26/0858 |
| | | | | 359/214.1 |
| 2014/0313264 | A1 | 10/2014 | Cattaneo et al. | |
| 2016/0341956 | A1 | 11/2016 | Yasuda | |
| 2016/0349530 | A1 | 12/2016 | Liao | |
| 2020/0371376 | A1* | 11/2020 | Giusti | H02N 2/028 |
| 2021/0347634 | A1* | 11/2021 | Giusti | H04R 19/02 |

OTHER PUBLICATIONS

First Office Action and Search Report for family-related CN Appl. 202010444104.7, report dated Jun. 6, 2022, 7 pgs.

* cited by examiner

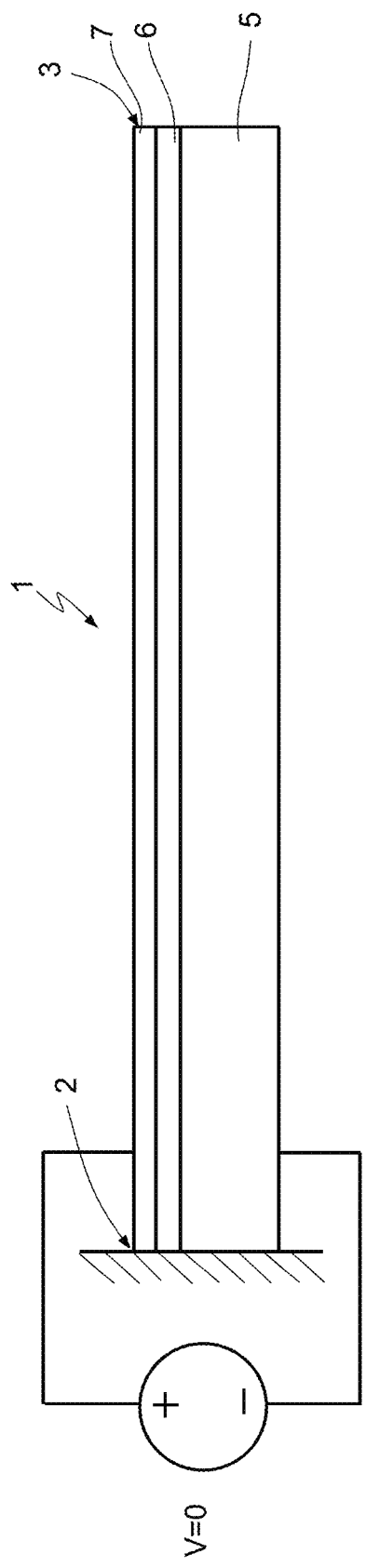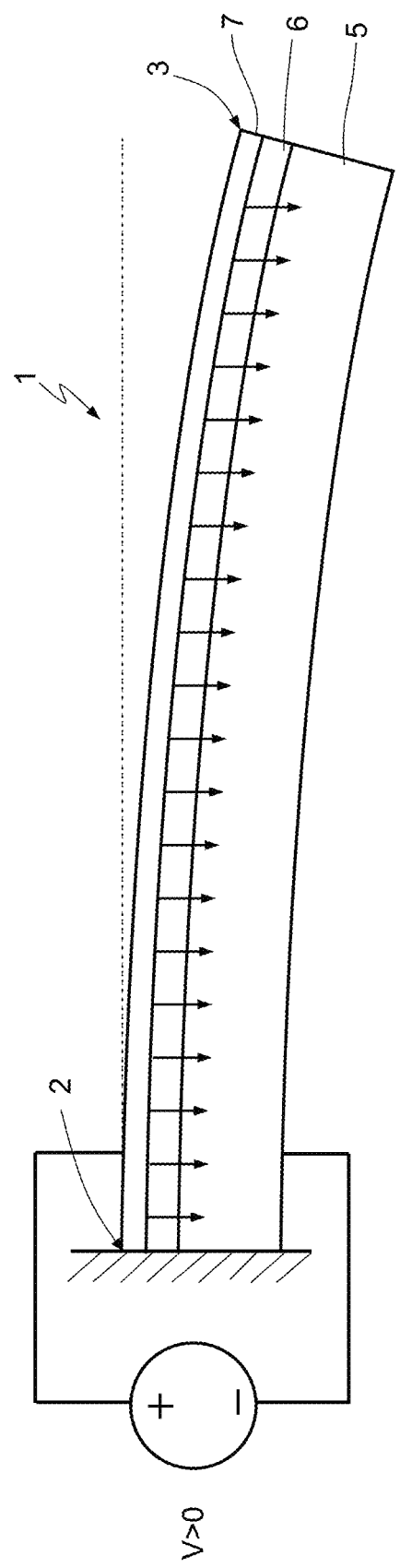
Fig.1A
Fig.1B

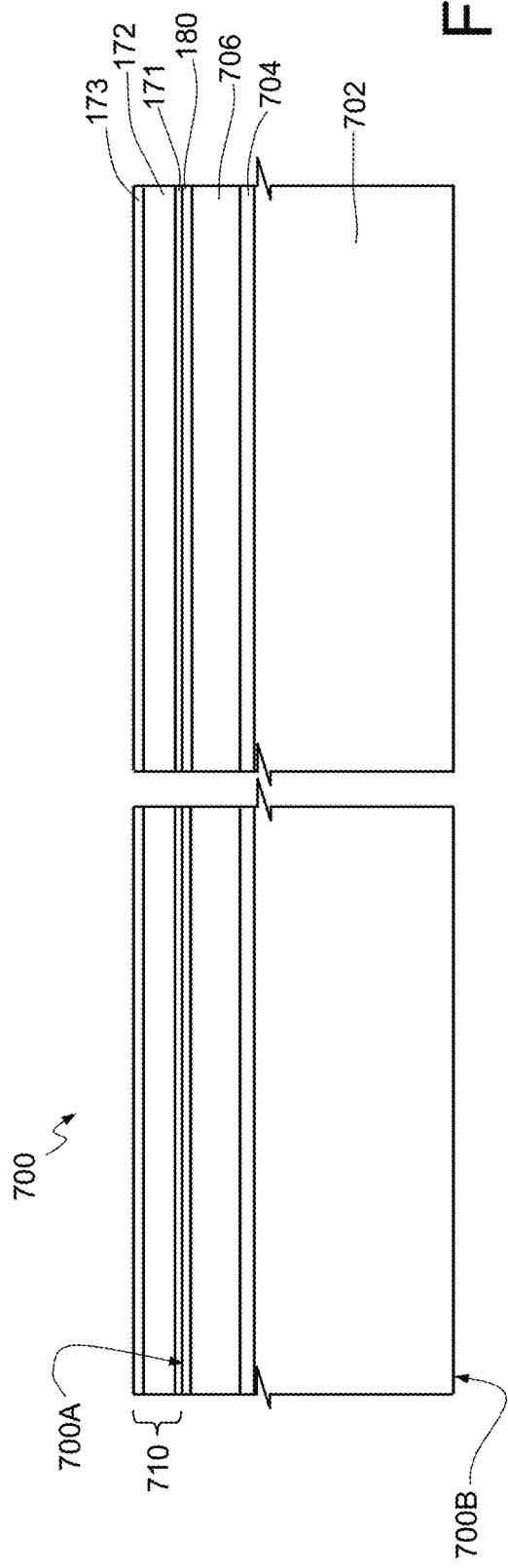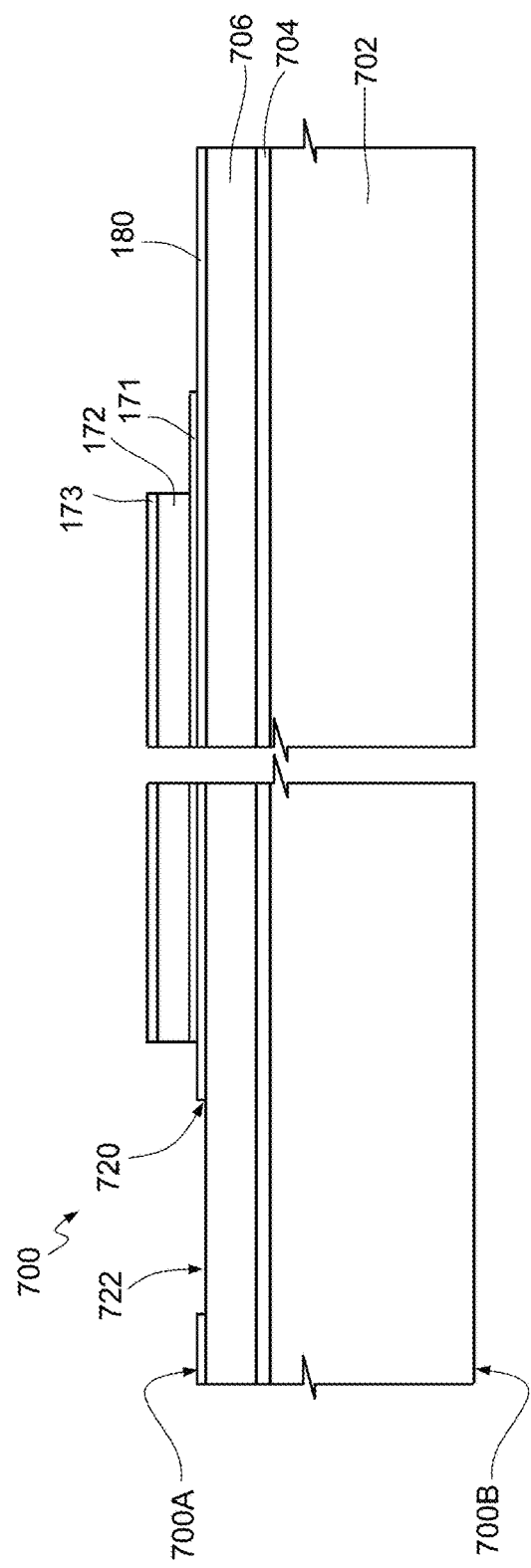

PIEZOELECTRIC MEMS ACTUATOR FOR COMPENSATING UNWANTED MOVEMENTS AND MANUFACTURING PROCESS THEREOF

PRIORITY CLAIM

This application claims the priority benefit of Italian Application for Patent No. 102019000007219, filed on May 24, 2019, the content of which is hereby incorporated by reference in its entirety to the maximum extent allowable by law.

TECHNICAL FIELD

This disclosure relates to a Micro-Electro-Mechanical System (MEMS) piezoelectric actuator for compensating unwanted movements and to a manufacturing process thereof. In particular, hereinafter reference is made to a piezoelectric MEMS actuator configured to carry out optical image stabilization (OIS) in optical devices such as, for example, digital still cameras (DSCs), in particular for autofocus applications, without this disclosure being limited thereto.

BACKGROUND

As is known, actuators are devices that convert a physical quantity of one type into another physical quantity of a different type; in particular, the quantity deriving from conversion usually leads to some form of movement or mechanical action.

Recently, actuators of micrometric and nanometric dimensions have been proposed, also referred to as micro-actuators or nano-actuators, which can be manufactured using a semiconductor technology (for example, MEMS technology) and therefore at contained costs. Such micro-actuators and nano-actuators may be used in a wide range of devices, in particular in mobile and portable devices.

Examples of micro-actuators are valves, switches, pumps, linear and rotary micromotors, linear positioning devices, speakers and optical devices (for example, optical autofocus devices).

Known micro-actuators may work according to four physical principles:

Electrostatic: they exploit the attraction between conductors that are oppositely charged;

Thermal: they exploit the displacement caused by thermal expansion or contraction;

Piezoelectric: they exploit the displacement caused by stresses and strains induced by electrical fields; and Magnetic: they exploit the displacement caused by the interaction between different elements having magnetic characteristics, such as permanent magnets, external magnetic fields, magnetizable materials, and electric current conductors.

Each technology has advantages and limits in terms of power consumption, movement rapidity, force exerted, movement amplitude, movement profile, simplicity of manufacture, amplitude of the applied electrical signals, robustness, and sensitivity, which render use thereof advantageous in certain applications, but not in others and therefore determine their field of use.

Hereinafter a MEMS actuator operating according to the piezoelectric principle and in particular exploiting MEMS thin-film piezo (TFP) technology is considered.

TFP MEMS technology currently uses a unimorphic mode of actuation, wherein a structure (for example, a membrane, a beam or a cantilever), usually formed of at least two superimposed layers, undergoes bending as a result of variations in the applied stress. In this case, a controlled alteration of the strain is obtained in one of the layers, referred to as active layer, which causes a passive strain in the other layer or layers, referred to also as inactive or passive layers, with consequent bending of the structure.

The above technique is advantageously used for bending the membrane, the beam, or the cantilever in applications where it is desired to obtain a vertical movement, i.e., a movement in a direction perpendicular to the plane in which the structure lies, for example, in an ink printhead, autofocus systems, micro-pumps, microswitches and speakers.

For instance, FIGS. 1A and 1B show a cantilever beam 1 constrained at a first end 2 and free to bend at a second end 3. The beam 1 is here formed by a stack of layers including: a supporting layer 5, for example, of semiconductor material with a first conductivity type, for example, P; an active layer 6, for example, of piezoelectric material (PZT); and a top layer 7, for example, of semiconductor material with a second conductivity type, for example, N.

In presence of a reverse biasing, as illustrated in FIG. 1B, the applied electrical field causes strains in the beam 1, which causes a movement of the second end 3 downwards.

An embodiment of a piezoelectric MEMS actuator applied to a generic optical device is illustrated in FIGS. 2A and 2B. Here, the optical device, designated by 10, comprises a deformable part or membrane 15, for example of glass, such as BPSG (BoroPhosphoSilicate Glass), resting, through a lens element 11 (for example of polymeric material), on a support 12, which is also, for example, of glass; the membrane 15 further carries two piezoelectric regions 13, arranged at a mutual distance apart.

In absence of biasing, in FIG. 2A, the membrane 15 and the lens element 11 have planar surfaces and do not modify the path of a light beam 16 that passes them. When the piezoelectric regions 13 are biased, in FIG. 2B, they cause a deformation of the membrane 15. The deformation of the central area of the membrane 15 is transmitted to the lens element 11, whose top surface bends, modifying the focus of the lens element 11 and therefore the path of the light beam 16. It is thus possible to modify the characteristics of optical transmission of the optical device 10.

It is furthermore known that known optical devices, such as digital still cameras, may be subject, in use, to unwanted movements induced from outside, such as vibrational movements induced by quivering of the user's hand that is using the digital still camera.

In particular, in use, one or more lenses of the optical device receive a light beam and focus it towards an image sensor, housed in the optical device; next, the image sensor receives and processes the focused light beam to generate an image.

However, when the optical device is subjected to unwanted movements, the optical path of the light beam through the lenses towards the image sensor is deflected; consequently, the image sensor receives the light beam in a shifted position with respect to the case with no movements induced from outside. Consequently, the image sensor may generate a low quality image, for example, an out-of-focus image.

To address this issue, in the last few years optical devices integrating actuators and corresponding sensing systems configured to quantify and compensate the unwanted movements have been developed.

For instance, U.S. Pat. No. 9,625,736, incorporated by reference, describes an actuator of the type schematically represented in FIGS. 3A-3B. In particular, FIG. 3A shows an example of a portion of an optical device 30 (e.g., a digital still camera) including an actuator 40 for compensating unwanted movements induced from outside and generating displacements along an X axis and an Y axis of a Cartesian reference system XYZ. In the example illustrated, the actuator 40 is a voice coil motor (VCM), i.e. an electromagnetic actuator.

The optical device 30 comprises a supporting structure 32, comprising a casing 52 (not shown in FIG. 3B for clarity reasons), and a substrate 42 defining a first and a second surface 32A, 32B. The supporting structure 32 houses a first cavity 34, in communication with the external environment through an opening 36 formed in the casing 52 at the first surface 32A. In particular, the cavity 34 houses the actuator 40.

The substrate 42, of semiconductor material (e.g. polysilicon), has a recess 44 facing the outside of the supporting structure 32 and housing a first printed circuit board (PCB) 46.

The first printed circuit board 46 carries a movement sensor 48 and an integrated driving circuit 49, electrically coupled together through conductive paths (not illustrated).

A first, a second, a third, and a fourth permanent magnetic element 51A-51D are arranged within the supporting structure 32 and have, for example, a parallelepipedal shape with a reduced thickness in top view (FIG. 3B). In particular, the first and the second permanent magnetic elements 51A, 51B have a magnetization opposite to each other, extend on two opposite sides of the supporting structure 32 and have longer sides (in the top view of FIG. 3B) parallel to the X axis of the Cartesian reference system XYZ; likewise, the third and the fourth permanent magnetic elements 51C, 51D have a magnetization opposite to each other, extend on further two opposite sides of the supporting structure 32, and have longer sides (in the top view of FIG. 3B) parallel to the Y axis of the Cartesian reference system XYZ.

The permanent magnetic elements 51A-51D are arranged along the side walls of the casing 52, inside it, and surround the actuator 40 at a distance.

The casing 52 extends alongside and over the permanent magnetic elements 51A-51D, as well as at least in part extends laterally with respect to the substrate 42 (FIG. 3A).

The optical device 30 further comprises an image acquisition module 38, including a first and a second optical module 60, 61, coaxial to each other and having an optical axis S parallel to the Z axis.

In detail, the first module 60 comprises a first lens 70, configured to receive a light beam 72 from the external environment. The second module 61 comprises second lenses 71 (three schematically shown in FIG. 3), optically coupled to the first lens 70.

The image acquisition module 38 is accommodated in a barrel 80, in a cavity 81 thereof.

Moreover, the optical device 30 comprises a second printed circuit board 82, coupled to the barrel 80 at a top surface 82A thereof to delimit the cavity 81 of the barrel 80 at the bottom. An image sensor 84 extends on the top surface 82A of the second printed circuit board 82; for example, the image sensor 84 is formed by an array of diodes and is electrically coupled to the second printed circuit board 82. Moreover, the image sensor 84 is operatively coupled to the image acquisition module 38; in particular, the first and the second optical modules 60, 61 are configured to focus the light beam 72 on the image sensor 84.

The actuator 40 of the optical device 30 comprises a magnetic body 90 (e.g. of ferromagnetic material), surrounding the barrel 80, and a coil 92, extending around the magnetic body 90 and electrically coupled to the integrated driving circuit 49 by conductive paths (not shown).

In use, when the optical device 30 is subject to unwanted movements induced from outside, the movement sensor 48 detects these movements and generates an electrical signal, which is transmitted to the integrated driving circuit 49; the integrated driving circuit 49 processes the electrical signal and determines, for example, the magnitude and direction of the force generated by the movements on the optical device 30.

On the basis of the processed information, the integrated driving circuit 49 generates a current that is fed to the coil 92 to move the image detection structure 38 along the X and Y axes.

In detail, as a result of passage of the current in the coil 92, a Lorentz force acts between the actuator 40 and the permanent magnetic elements 51A-51D and causes movement of the image acquisition module 38, together with the barrel 80 and the second printed circuit board 82, toward the first or the second permanent magnetic element 51A, 51B (movement along X) and/or towards the third or the fourth permanent magnetic element 51C, 51D (movement along Y).

Consequently, the light beam 72 is deflected by an angle correlated to the magnitude of the Lorentz force, compensating the unwanted movements.

The actuator 40 of the optical device 30 enables a correction of the optical path of the light beam 72 by an angle that, for medium-level digital still cameras is, for example, ±0.75° and, for professional digital still cameras, is, for example, ±1.50°.

However, optical devices of the type illustrated in FIG. 3 have some disadvantages.

In particular, the actuator 40 moves the image acquisition module 38 at a limited speed, since the electromagnetic actuation is slow.

Moreover, the current used by the coil 92 of the actuator 40 to generate a Lorentz force sufficient to compensate the unwanted movements induced from outside is high (e.g. comprised between 50 mA and 80 mA).

There is a need in the art to provide a MEMS actuator and a manufacturing process therefore that overcome the drawbacks of the prior art.

SUMMARY

According to this disclosure, a MEMS actuator and a manufacturing process thereof are provided.

BRIEF DESCRIPTION OF THE DRAWINGS

For a better understanding, embodiments thereof are now described, purely by way of non-limiting example, with reference to the attached drawings, wherein:

FIGS. 1A and 1B show simplified side views of a known piezoelectric MEMS actuator in a resting condition and in a deformation condition, respectively;

FIGS. 11-15 are cross-sections through a portion of the MEMS actuator of FIGS. 3, 9, and 10, in subsequent manufacturing steps.

DETAILED DESCRIPTION

Figure 2A:
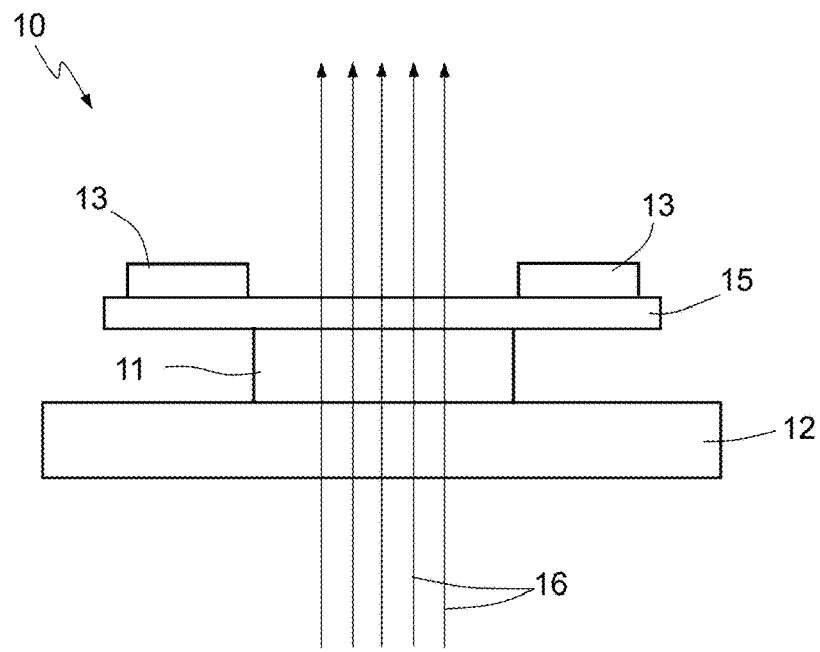
FIGS. 2A and 2B show simplified side views of another known piezoelectric MEMS actuator, used in an optical device in a resting position and in a deformation condition, respectively.
Figure 2B:
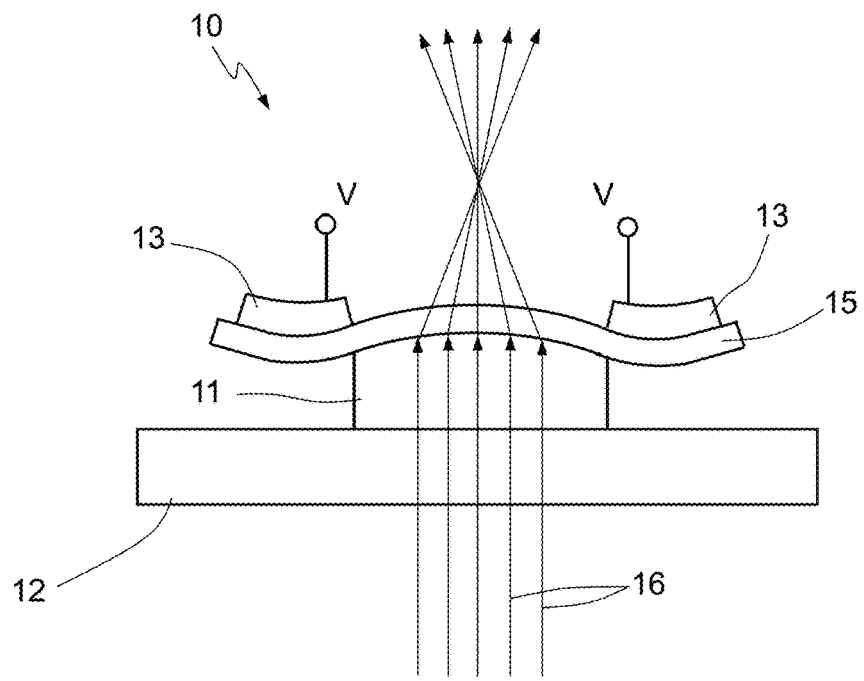
Figure 3A:
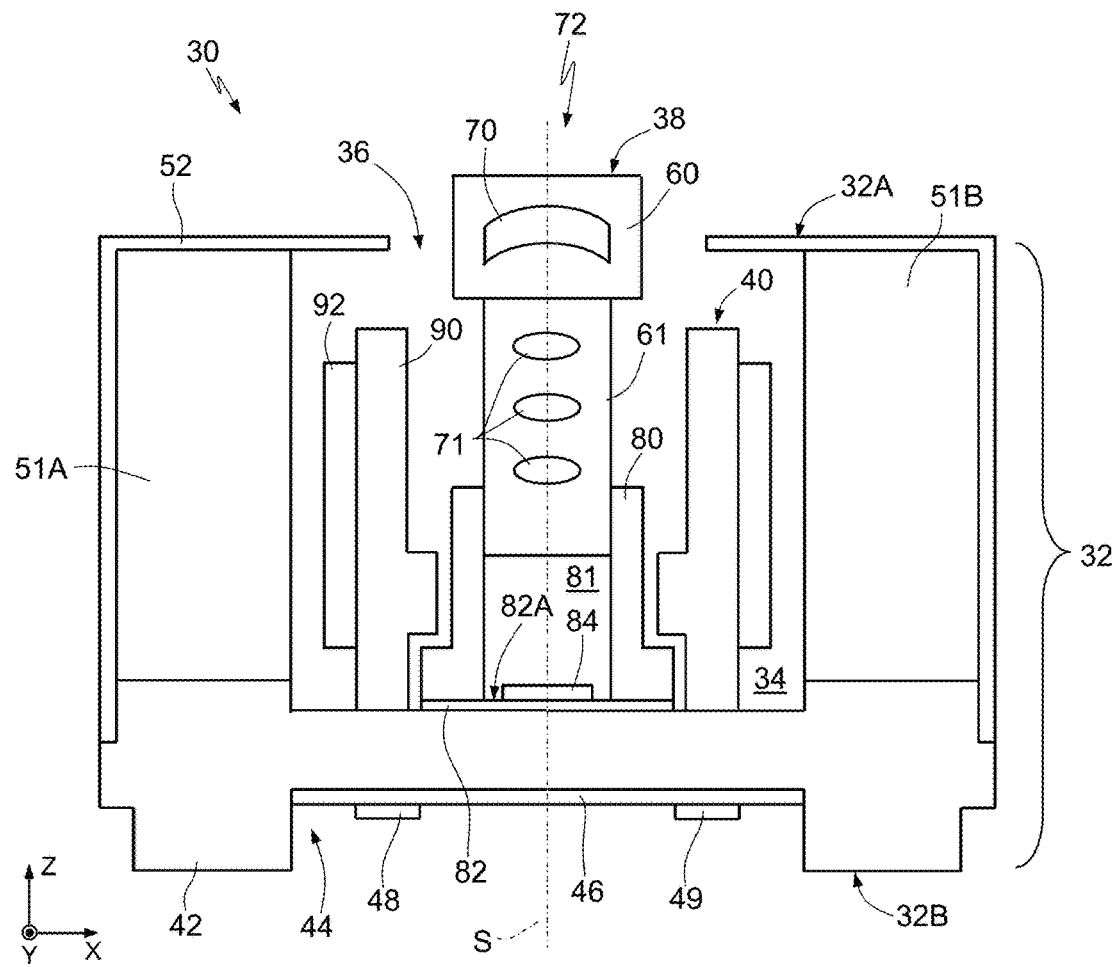
FIG. 3A is a schematic cross-section of a known optical device.
Figure 3B:
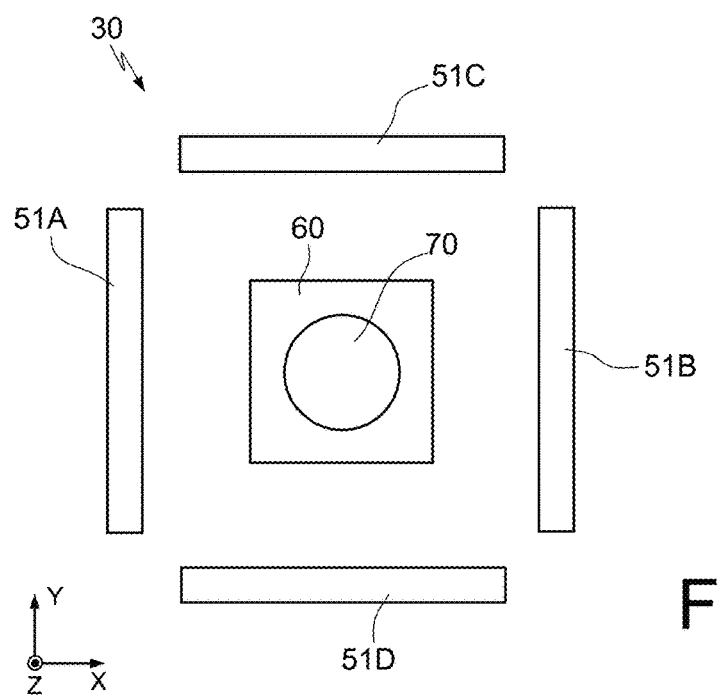
FIG. 3B is a schematic top view with removed parts of the optical device of FIG. 3A.
Figure 4:
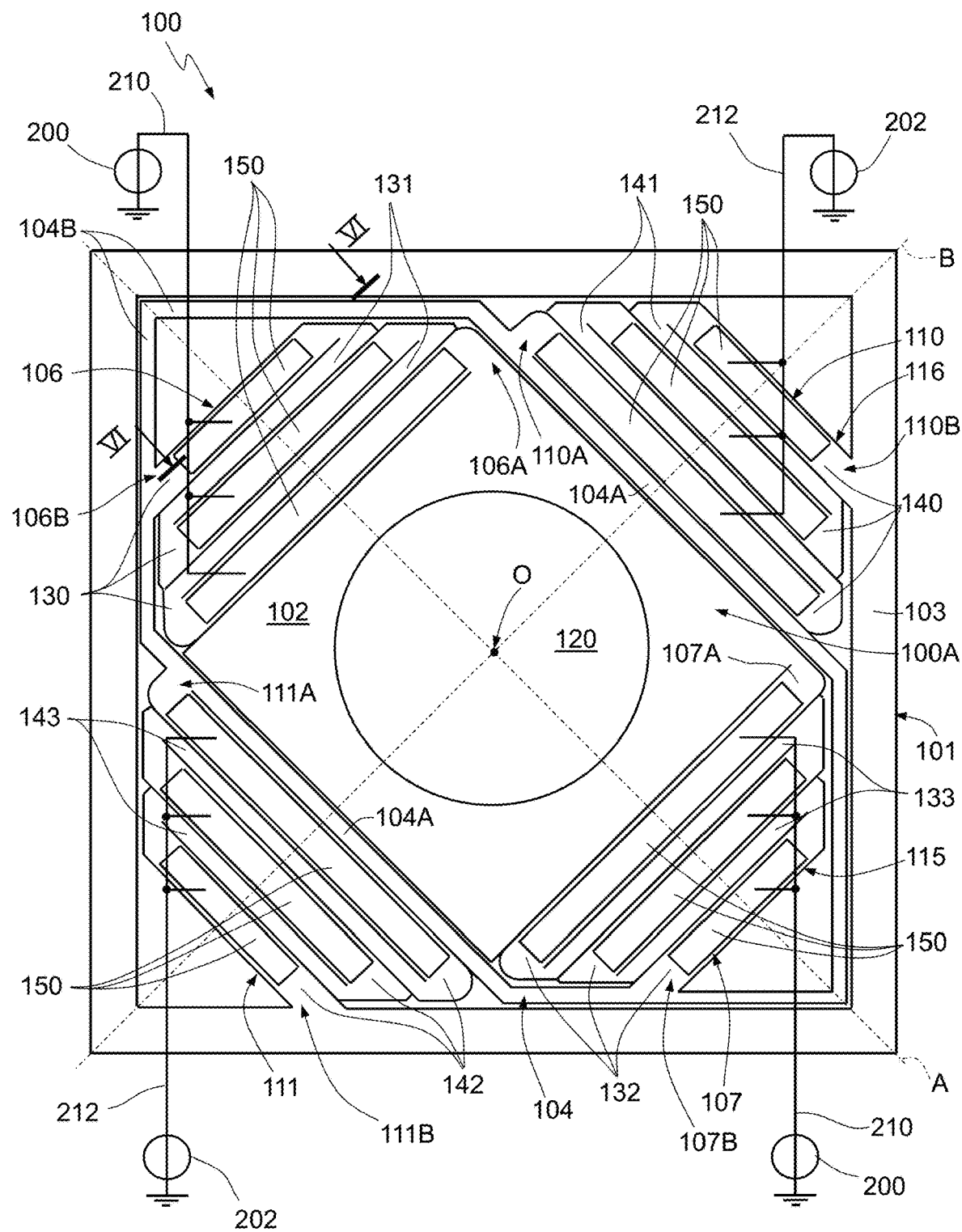
FIG. 4 shows a top view of the present MEMS actuator according to a first embodiment.
Figure 5:
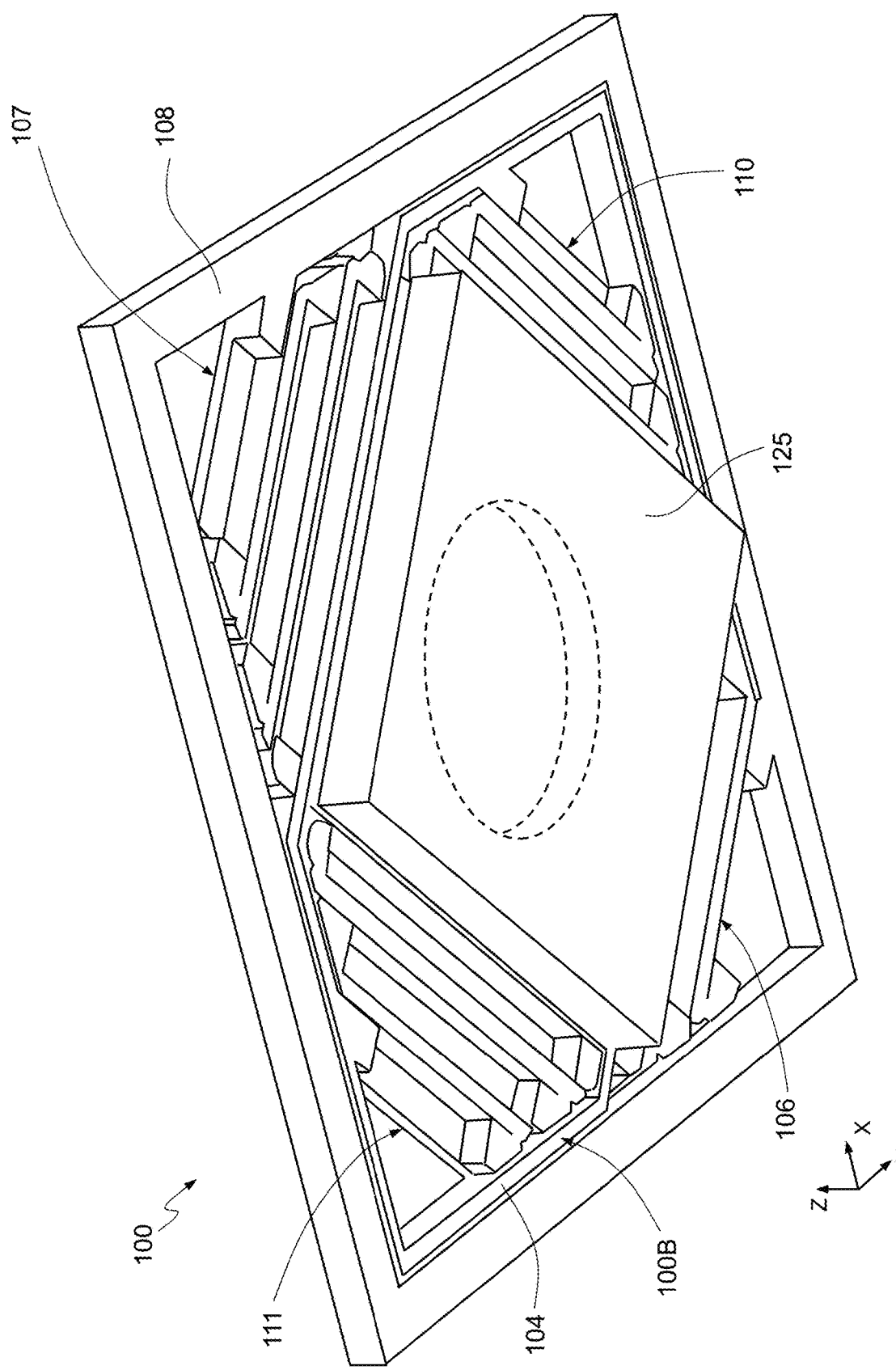
FIG. 5 is a perspective bottom view of the MEMS actuator of FIG. 4.
Figure 6:
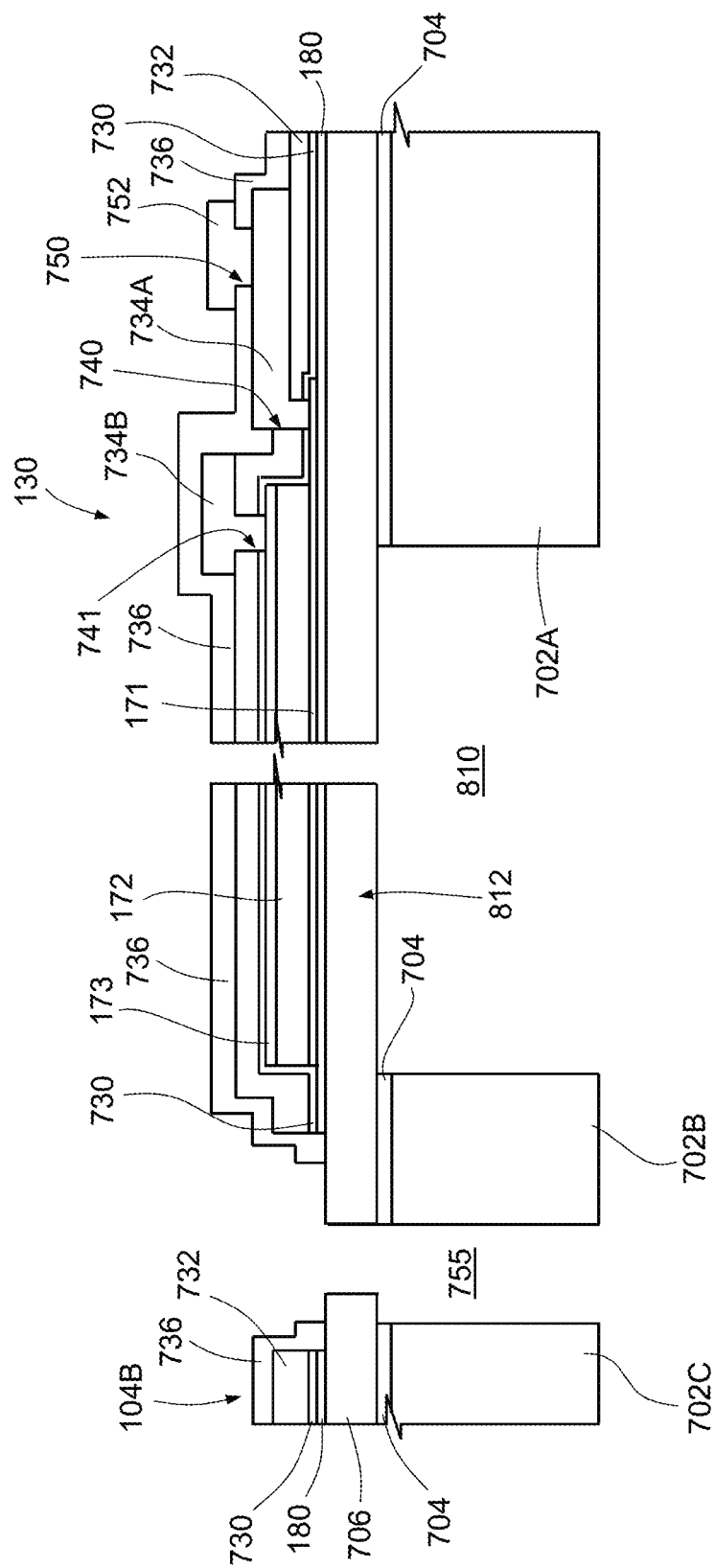
FIG. 6 is a longitudinal section of a part of the MEMS actuator of FIG. 4, taken along section line VI-VI of FIG. 4.

FIGS. 4-6 show schematically a MEMS actuator 100 of a piezoelectric type. In particular, the MEMS actuator 100 is configured to integrate optical devices, for example for autofocus, and allows compensation of unwanted movements.

The MEMS actuator 100 is formed by a monolithic body 101 of semiconductor material (e.g., polysilicon) having a generally parallelepipedal shape with a first and a second larger surface 100A, 100B and a reduced thickness (in a direction parallel to a Cartesian axis Z of a Cartesian reference system XYZ). In the embodiment of FIGS. 4-6, the MEMS actuator 100 has (in top view) a square shape, with a side of, for example, 7 mm×7 mm and a depth (in the Z direction) of, for example, 710 μm.

The body 101 of the MEMS actuator 100 comprises a supporting portion 102 having, in top view (FIG. 4), a quadrangular shape (for example, square); and a first frame 104 surrounding the supporting portion 102, having a polygonal shape in top view (for example, of an elongated hexagon), and coupled to the supporting portion 102 by first deformable elements 115; and a second frame 108 surrounding the first frame 104, having, in top view, a quadrangular shape (for example, square), and coupled to the first frame 104 by second deformable elements 116. The second frame 108 is here rotated through 45° with respect to the first frame 104.

In particular, in the embodiment shown in FIGS. 4-6, the two diagonals of the second frame 108 form a first and a second symmetry axis A, B of the supporting portion 102, transverse (in particular, perpendicular) with respect to each other and further forming symmetry axes for the first frame 104, which is elongated in the direction of the first symmetry axis A. In particular, the first frame 104 has two longer sides 104A, parallel to each other and to the first symmetry axis A, and four shorter sides 104B (parallel two by two), transverse with respect to the symmetry axes A and B (here set at 45°). The longer sides 104A of the first frame 104 are therefore transverse (at 45°) with respect to the sides of the second frame 108, and the shorter sides 104B of the first frame 104 are parallel (two by two) to the sides of the second frame 108.

In particular, the symmetry axes A, B intersect each other at a center O and lie in an XY plane of the Cartesian reference system XYZ, similar to the larger surfaces 100A, 100B of the MEMS actuator 100, due to the negligible depth of the MEMS actuator 100 (along the axis Z).

The supporting portion 102 has an opening 120 having, for example, a circular shape, with center O at the center of the second frame 108 and of the MEMS actuator 100.

The MEMS actuator 100 carries a lens 125 of transparent material (e.g., glass, such as BPSG, silicon oxide, or PSG) bonded, for example glued, to the supporting portion 102 on the second surface 100B of the actuator and here having a parallelepipedal shape. In greater detail, the opening 120 is configured to enable, in use, the passage of a light beam through the lens 125.

The first deformable elements 115 comprise a first and a second spring element 106, 107; moreover, the second deformable elements 116 comprise third and fourth spring elements 110, 111.

The first and the second spring elements 106, 107 are symmetrical to each other with respect to the second symmetry axis B, are fixed to the supporting portion 102 by respective first ends 106A, 107A, and fixed to the first frame 104 by respective second ends 106B, 107B. In the embodiment illustrated in FIGS. 4 and 5, the first and the second spring elements 106, 107 have a serpentine shape.

In particular, the first and the second spring elements 106, 107 comprise respective first and second deformable arms 130, 132 and respective first and second connection arms 131, 133, which extend parallel to each other and to the second symmetry axis B, as well as perpendicular to the first symmetry axis A. The first and the second connection arms 131, 133 are interposed between two respective first and second deformable arms 130, 132 successive to each other along the serpentine shape (in a direction parallel to the first symmetry axis A). In particular, each connection arm 131, 133 connects subsequent ends of the deformable arms 130, 132 arranged on opposite sides of the first symmetry axis A.

Likewise, the third and the fourth spring elements 110, 111 are symmetrical to each other with respect to the first symmetry axis A and are fixed to the first frame 104 at respective first ends 110A, 111A and to the second frame 108 at respective second ends 110B, 111B. In the embodiment illustrated in FIGS. 4 and 5, the third and the fourth spring elements 110, 111 also have a serpentine shape.

Similarly to the first and the second spring elements 106, 107, the third and the fourth spring elements 110, 111 comprise each respective third and fourth deformable arms 140, 142 and respective third and fourth connection arms 141, 143, extending parallel to each other and to the first symmetry axis A, as well as perpendicular to the second symmetry axis B. The third and the fourth connection arms 141, 143 are interposed between respective successive third and fourth deformable arms 140, 142 (in a direction parallel to the second symmetry axis B) to form the serpentine structure.

The first ends 106A, 107A of the first and the second spring elements 106, 107 are fixed to the supporting portion 102 in a symmetrical position with respect to the second symmetry axis B, spaced at a distance from, and on the same side of, the first symmetry axis A, for example, in proximity to the third spring element 110. Moreover, the second ends 106B, 107BA of the first and the second spring elements 106, 107 are fixed to the first frame 104 at two respective shorter sides 104B, in a symmetrical position with respect to the second symmetry axis B, and are spaced at a distance from, and on the same side of, the first symmetry axis A, here in proximity to the fourth spring element 111.

Likewise, the first ends 110AB, 111A of the third and the fourth spring elements 110, 111 are fixed to the first frame 104 at two respective longer sides 104A, in a position symmetrical with respect to the first symmetry axis A, and are spaced at a distance from, and on the same side of, the second symmetry axis B, for example, adjacent to the first spring element 106. Moreover, the second ends 110B, 111B of the third and the fourth spring elements 110, 111 are fixed to the second frame 108 in a position symmetrical with respect to the first symmetry axis A, and are spaced at a distance from, and on the same side of, the second symmetry axis B, here in a position adjacent to the second spring element 107.

Due to the arrangement of the deformable arms 130, 132, 140, 142 and of the connection arms 131, 133, 141, 143 transverse to the sides of the second frame 108, in proximity to the corners of the latter, they have variable lengths, as may be seen in FIGS. 4 and 5.

As may be seen in particular in FIG. 5, the deformable arms 130, 132, 140, 142 have a smaller thickness than the rest of the body 101, except at their own ends, so as to have a high flexibility, as described in detail hereinafter with reference to FIG. 6. For instance, they may have a thickness comprised between 4 μm and 100 μm, in particular here 80 μm. Each of the deformable arms 130, 132, 140, 142 carries a respective strip 150 of piezoelectric material, for example of a ceramic with a base of lead-titanate-zirconate (PZT) or of aluminum nitride (AlN).

FIG. 6 shows the structure of the first deformable arm 130; this structure is identical also for the deformable arms 132, 140, 142. Furthermore, FIG. 6 also shows a portion of the first frame 104 (in particular, of one of the longer sides 104A).

In detail, the deformable arm 130 comprises a first and a second substrate portion 702A, 702B, laterally delimiting a cavity 810. The longer side 104A comprises a third substrate portion 702C, laterally delimiting, together with the second substrate portion 702B, a trench 755.

A first insulating layer 704, for example, of silicon oxide, extends on the substrate portions 702A-702C.

A membrane layer 706, of semiconductor material (e.g., polysilicon), extends on the first insulating layer 704; in particular, it is partially suspended over the cavity 810 to form here a membrane 812 (portion of reduced thickness, also visible in FIG. 5).

A second insulating layer 180, for example of silicon oxide, extends at least in part over the membrane layer 706.

The strip 150 extends on the second insulating layer 180; in particular, the first strip 150 comprises a stack formed by a first electrode 171, a piezoelectric region 172 and a second electrode 173. The strip 150 forms a capacitor. In use, the first electrode 171 is connected to a reference potential (for example, ground) and the second electrode 173 is connected to a voltage source 200 through first conductive paths 210 (schematically illustrated in FIG. 4).

A first passivation layer 730, for example of aluminum oxide, extends on the first insulating layer 180 and on the first and the second electrodes 171, 173, as well as alongside the piezoelectric region 172; moreover, a second passivation layer 732, for example of USG (Undoped Silicon Glass), extends over the first passivation layer 730. In particular, a first and a second contact opening 740, 741 extend through the first and the second passivation layers 730, 732 and expose portions of the first and the second electrodes 171, 173, respectively, of the strip 150.

A first and a second metallization layer 734A, 734B, of conductive material, extend on the second passivation layer 732 and in the contact openings 740, 741 to electrically contact the first and the second electrodes 171, 173.

A third passivation layer 736, for example, of nitride, extends on the second passivation layer 732 and on the first and the second metallization layers 734A, 734B. A third contact opening 750 extends through the third passivation layer 736 and exposes a portion of the first metallization layer 734A.

A contact layer 752, of conductive material (for example, gold, Au), extends on the third passivation layer 736 and fills the third contact opening 750 to electrically contact the first metallization layer 734A.

With reference once again to FIG. 4, the strips 150 of the first and the second deformable arms 130, 132 are biased by the first voltage source 200 through the first conductive paths 210, and the strips 150 of the third and the fourth deformable arms 140, 142 are electrically connected to a second voltage generator 202 through second conductive paths 212 (schematically illustrated in FIG. 4).

Figure 7:
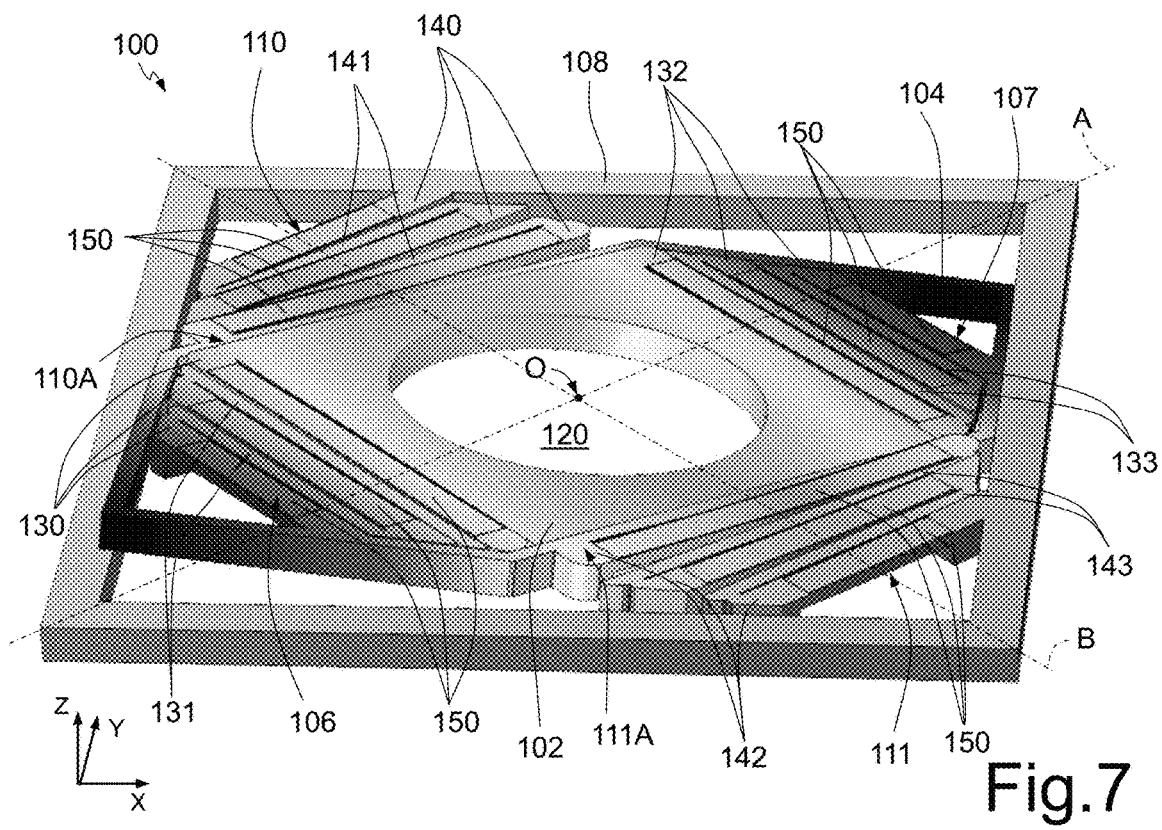
FIGS. 7 and 8 are perspective views of the MEMS actuator of FIG. 4, in different operating positions.

Application of a static actuation voltage (for example of 40 V) to the strips 150 of the third and the fourth deformable arms 140, 142 causes an upward deflection of the latter out of the XY plane; moreover, due to the absence of a bias of the third and the fourth connection arms 141, 143, these do not undergo deformation but rigidly rotate with the third and the fourth deformable arms 140, 142, respectively. Consequently, by virtue of also of the serpentine shape of the third and the fourth spring elements 110, 111, the first frame 104, the first spring element 106, the second spring element 107 and the supporting portion 102 rotate approximately about the second symmetry axis B, as illustrated in FIG. 7 (where the MEMS actuator 100 is shown rotated by 90° counterclockwise with respect to the top view of FIG. 5).

Figure 8:
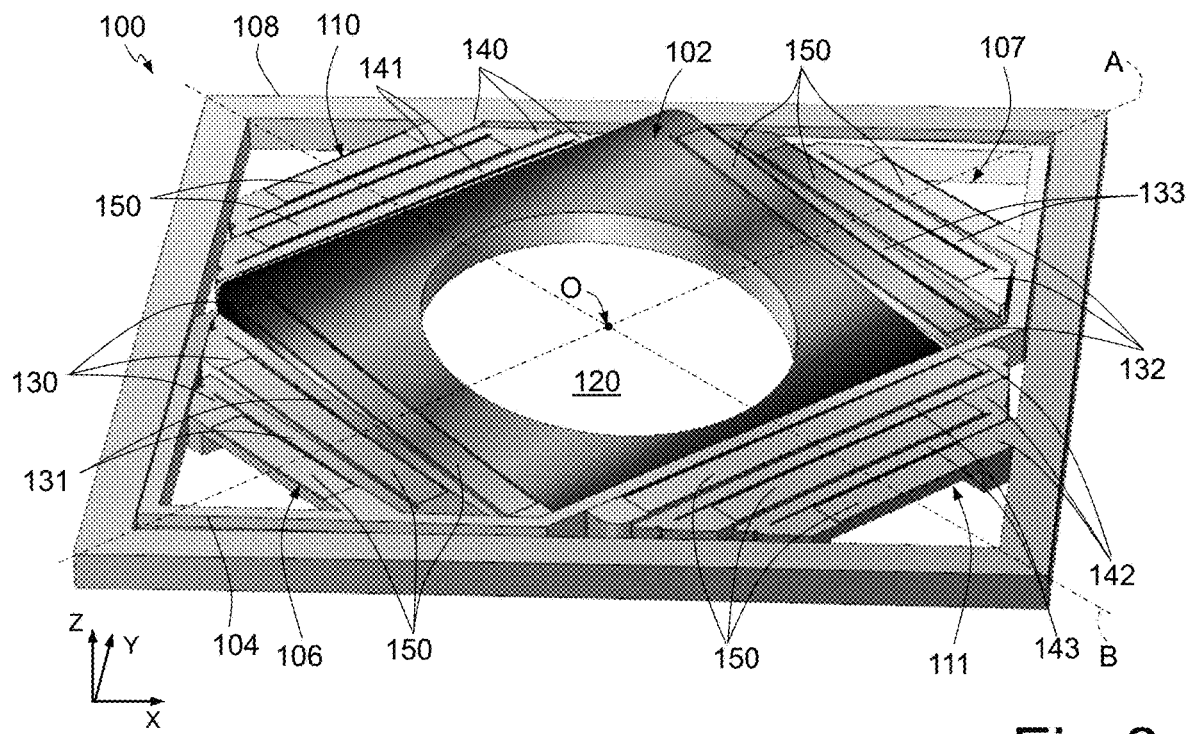

Likewise, by applying a static actuation voltage (for example of 40 V) to the strips 150 of the first and the second deformable arms 130, 132, it is possible to obtain a rigid rotation of the first and the second connection arms 131, 133 with the first and the second deformable arms 130, 132, respectively, as well as rotation of the supporting portion 102 approximately about the first symmetry axis A, as illustrated in FIG. 8 (where the MEMS actuator 100 is shown rotated through 90° counterclockwise with respect to the top view of FIG. 5).

By simultaneously biasing all the strips 150 and modulating the actuation voltage applied to them, it is possible to rotate the supporting portion 102 about both the rotation axes A, B by a selectable angle (up to a maximum value of, for example, 1.2°).

Figure 9:
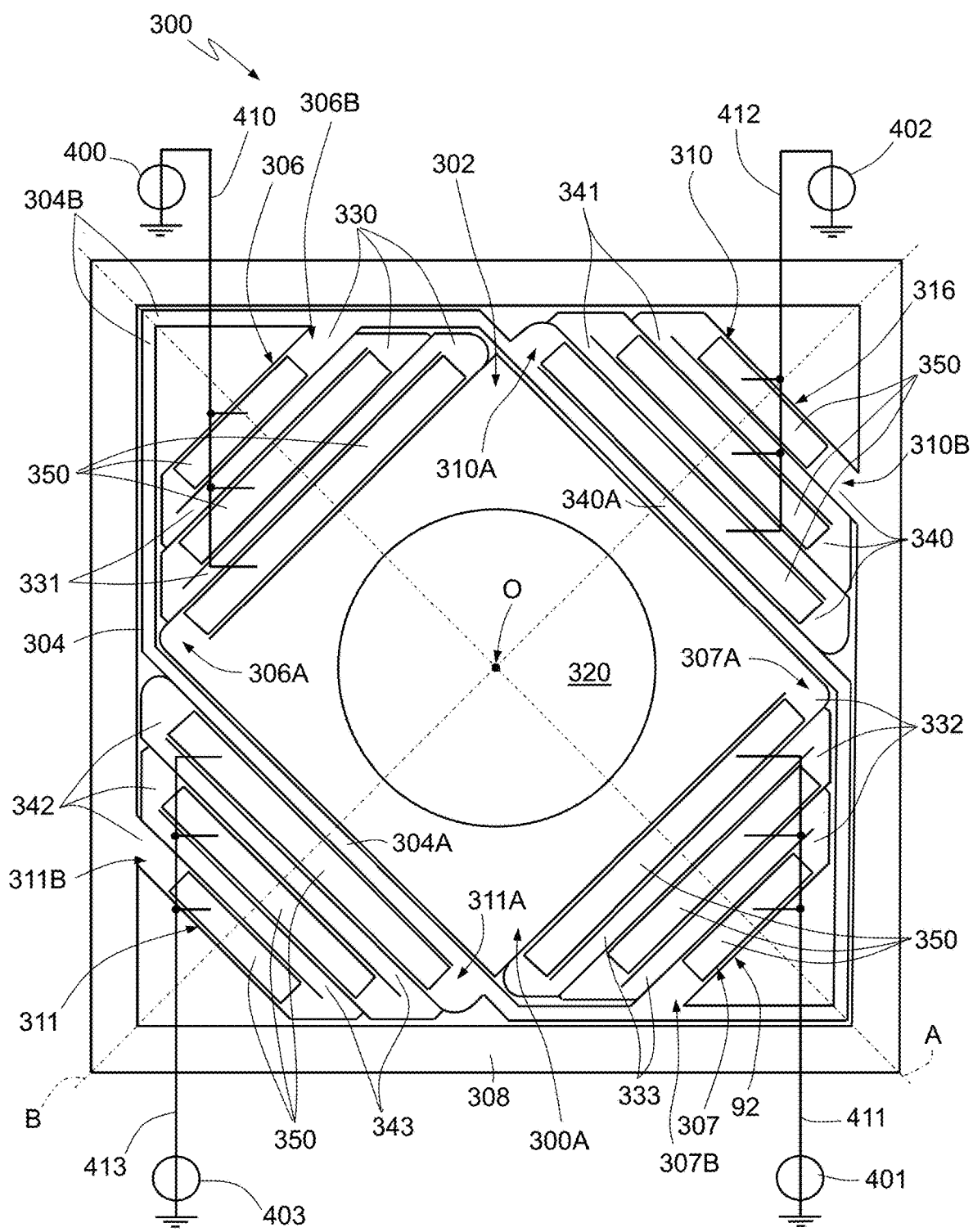
FIG. 9 is a top view of the present MEMS actuator according to another embodiment.

FIG. 9 shows another embodiment of the present MEMS actuator. In detail, FIG. 9 shows a MEMS actuator 300 having a general structure similar to the MEMS actuator 100 illustrated in FIGS. 4-6, so that parts similar to the ones illustrated and described with reference to FIGS. 4-6 are designated in FIG. 9 by reference numbers increased by 200 and will not be described any further.

In the embodiment of FIG. 9, the first and the second spring elements 306, 307 have first and second ends 306A, 307A and 306B, 307B and are arranged on opposite sides of both the first and the second symmetry axis A, B respectively; in general, the second spring element 307 may be obtained by rotating the first spring element 306 through 180° with respect to the center O. Likewise, the third and the fourth spring elements 310, 311 have first and second ends 310A, 311A and 310B, 310B and arranged, respectively, on opposite sides both of the first and of the second symmetry axis A, B; in general, the fourth spring element 311 may be obtained by rotating the third spring element 310 through 180° with respect to the center O.

In the present embodiment, each of the strips 350 is electrically connected to a respective voltage source 400-

403; in this way, in use, each strip 350 may be actuated independently from the other strips 350.

In use, the MEMS actuator 300 of FIG. 9 operates in a way similar to what described with reference to FIGS. 7-8, except for the first and the second spring elements 306, 307 cause rotations of the supporting portion 302 in the opposite direction approximately about the first symmetry axis A, and the third and the fourth spring elements 310, 311 respectively cause rotations of the first frame 304 and of the supporting portion 302 in the opposite direction approximately about the second symmetry axis B. The voltage sources 400 and 401 are therefore alternately activated, as well as the voltage sources 402, 403.

By providing the deformable arms 330, 332, 340, 342 with a thickness of 50 µm and controlling the voltage sources 400-404 with voltages that may be modulated up to 40 V, it is possible to orientate the supporting portion 302, and, therefore, the lens (not illustrated), by an angle, for example, of +1.57° and −1.57° with respect to the rotation axes A, B.

Figure 10:
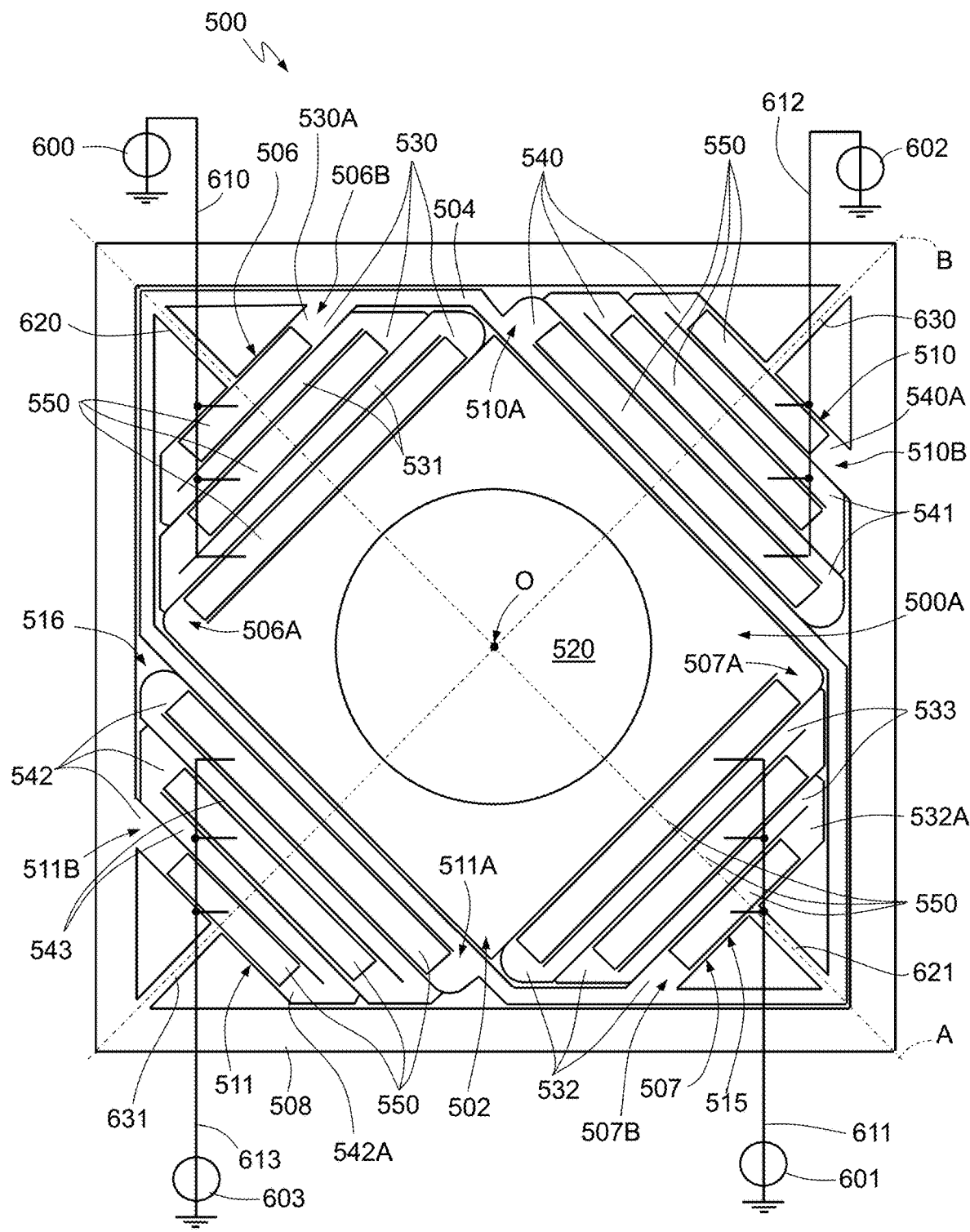
FIG. 10 is a top view of the present MEMS actuator according to a further embodiment.

FIG. 10 shows a further embodiment of the present MEMS actuator. In detail, FIG. 10 shows a MEMS actuator 500 having a general structure similar to the MEMS actuator 300 illustrated in FIG. 9; therefore parts similar to the ones illustrated and described with reference to FIG. 9 are designated in FIG. 10 by reference numbers increased by 200 and will not be described any further.

In particular, the MEMS actuator 500 comprises, in addition to the geometry described above with reference to FIG. 9, a first, a second, a third and a fourth torsional arm 620, 621, 630, 631, adapted to connect each spring element 506, 507, 510, 511 to the first and the second frames 504, 508, respectively. In particular, the torsional arms 620, 621 extend along the first symmetry axis A and are subject to torsional deformation about the axis A; likewise, the torsional arms 630, 631 extend along the second symmetry axis B and are subject to torsional deformation about axis B.

In detail, the first and the second torsional arms 620, 621 extend between a deformable arm 530A, 532A of the first and the second spring elements 506, 507, respectively, arranged in farther from the center O, and the corner facing the first frame 504 (the corner between the shorter sides 504B of the first frame 504, crossed by the first symmetry axis A).

Likewise, the third and the fourth torsional arms 630, 631 extend between a deformable arm 540A, 542A of the third and the fourth spring elements 510, 511, respectively, arranged in a farther from the center O, and the corner facing the second frame 508 (the corner between the sides of the second frame 508, crossed by the second symmetry axis B).

In use, the MEMS actuator 500 of FIG. 10 operates in a way similar to what described for the MEMS actuator 300 of FIG. 9.

From simulations, it has been verified that, with respect to the MEMS actuator 300 illustrated in FIGS. 9-13, the MEMS actuator 500 has a higher resistance to external loads, as well as a higher resonance frequency due to the presence of the torsional arms 620, 621, 630, 631; furthermore, it has been verified that the stress generated by an external load (for example, a pressure) prevalently concentrates in the torsional arms 620, 621, 630, 631.

FIGS. 11-15 show subsequent steps of a manufacturing process of the MEMS actuator 100, 300, 500, in particular the deformable arms 130, 132, 140, 142, 330, 332, 340, 342, 530, 532, 540, 542 and part of the first and the second frames 104, 108, 304, 308, 504, 508 facing them. For simplicity, hereinafter reference is made to the MEMS actuator 100, in particular to one of the deformable arms 130 and to a portion of the first frame 104 (in particular, one of the longer sides 104A).

In detail, FIG. 11 shows a first wafer 700, having a top surface 700A and a bottom surface 700B; in particular, the first wafer 700 is processed according to manufacturing steps that are similar to what described in United States Patent Application Publication No. 2014/0313264 A1, incorporated by reference. Consequently, the steps for manufacturing the first wafer 700 common to the above mentioned patent are briefly outlined hereinafter.

The first wafer 700 comprises a substrate 702, of semiconductor material (for example, silicon); the first insulating layer 704, extending on the substrate 702; the membrane layer 706, extending on the intermediate layer 704; the second insulating layer 180 of FIG. 6; and a first stack of layers 710, extending over the top surface 700A.

In detail, the first and the second insulating layers 704, 180 are formed according to known growth or deposition techniques, for example thermal growth, and have a thickness comprised, for example, between 0.1 and 2 µm. Moreover, the membrane layer 706 is epitaxially grown and has a thickness comprised, for example, between 25 and 100 µm, e.g. 60 µm.

The stack of layers 710 comprises layers that are designed to form the first electrode 171, the piezoelectric region 172, and the second electrode 173 of FIG. 6 and, therefore, are designated in FIG. 11 by the same reference numbers.

Next, FIG. 12, the stack of layers 710 is defined according to etching techniques so as to form the first and the second electrodes 171, 173, as well as the piezoelectric region 172. Moreover, the second insulating layer 180 is defined according to etching techniques to form an opening 720, which exposes a portion 722 of the membrane layer 706.

Figure 13:
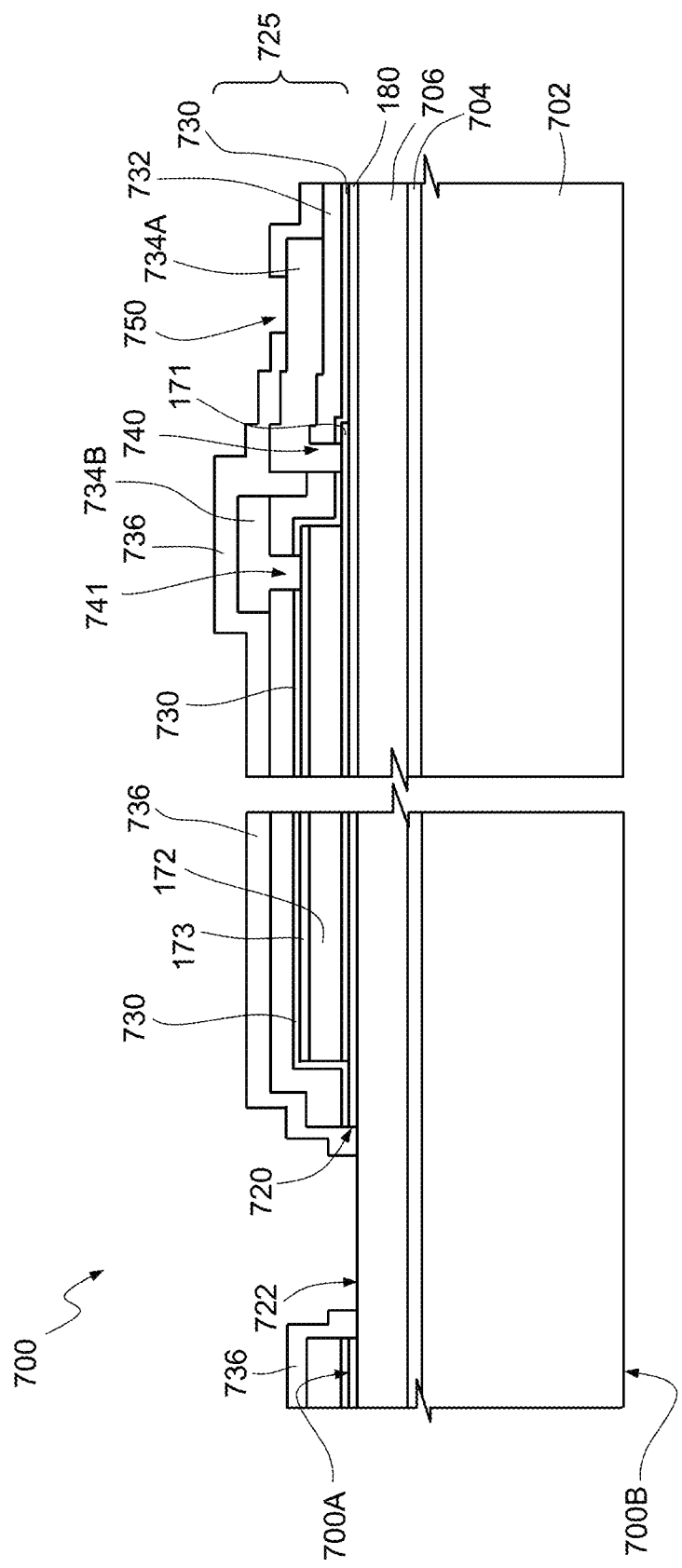

Next, FIG. 13, a second stack of layers 725 is deposited and defined according to deposition and definition techniques.

In particular, the second stack of layers 725 comprises the first passivation layer 730; and the second passivation layer 732, extending on the first passivation layer 730. The first and the second passivation layers 730, 732 are deposited and defined to form the first and the second contact opening 740, 741 and expose, respectively, portions of the first and the second electrodes 171, 173.

The second stack of layers 725 further comprises the first and the second metallization layers 734A, 734B, deposited and defined according to deposition and definition techniques, to form electrical connection lines.

The second stack of layers 725 further comprises the third passivation layer 736, which is defined to form the third contact opening 750 and, therefore, to expose at least in part the first metallization layer 734A.

Figure 14:
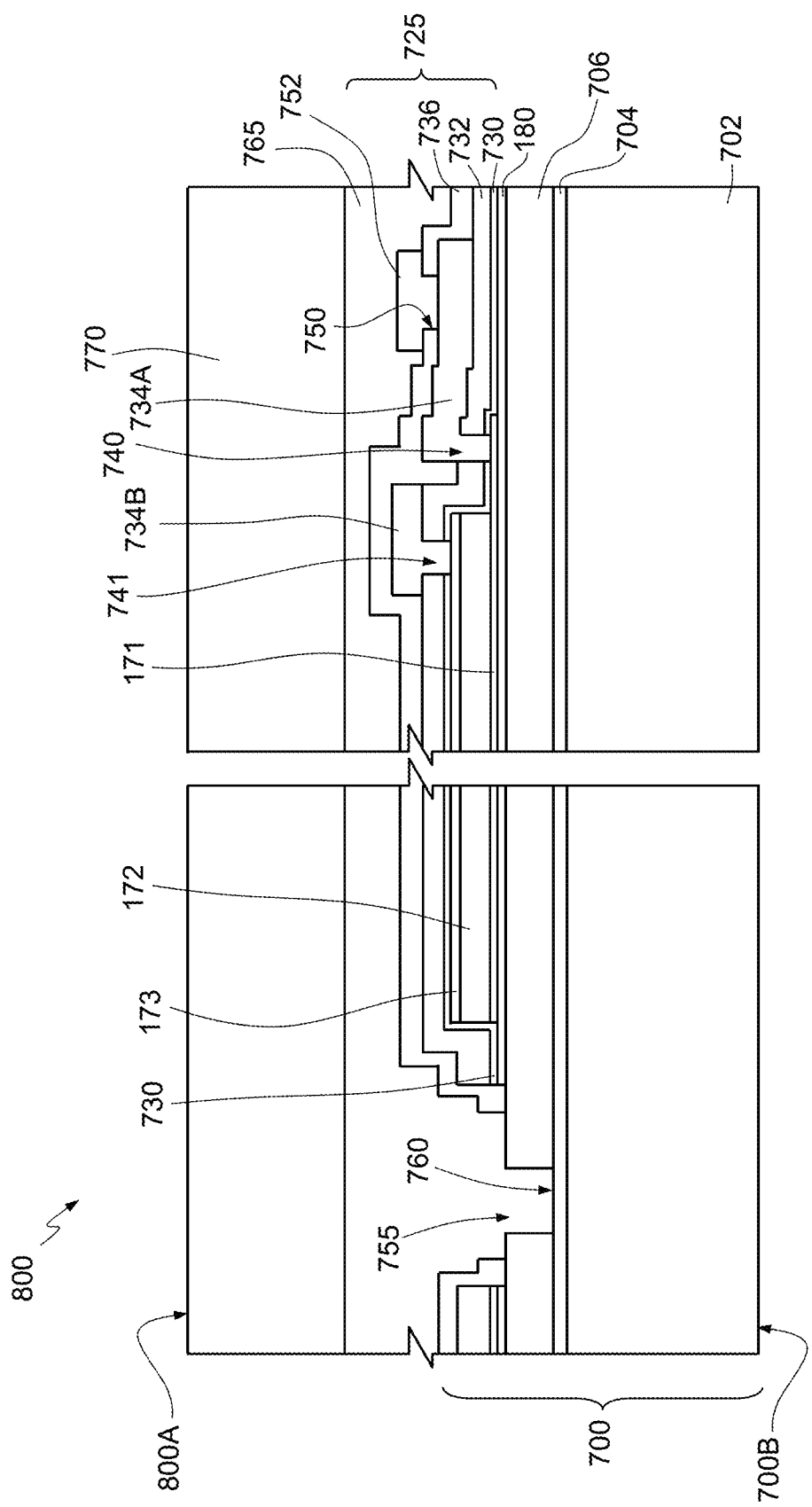

Next, FIG. 14, the contact layer 752 is deposited and defined.

Moreover, in a way not shown, the membrane layer 706 is etched using known etching techniques. In this step, the geometry of the thinner portions of the body 101 (in particular, membranes forming the deformable arms 130, 132, 140, 142) is defined. Then, trenches (trench 755 being visible in FIG. 6) are formed in the membrane layer 706.

In detail, an adhesive layer 765 (for example, a coupling adhesive such as BrewerBOND® 305, https://www.brewer-science.com/products/brewerbond-materials/, having a thickness so as to planarize the structure) is deposited on the third passivation layer 736 and on the contact layer 752 using deposition techniques.

Next, once again FIG. 14, a carrier wafer 770 is coupled to the adhesive layer 765; for example, the carrier wafer 770 may be a DSP (Double Side Polished) wafer having a thickness, for example, of 400 μm. In this way, a second wafer 800 is obtained, delimited at the top by a top surface 800A and at the bottom by the bottom surface 700B.

Figure 15:
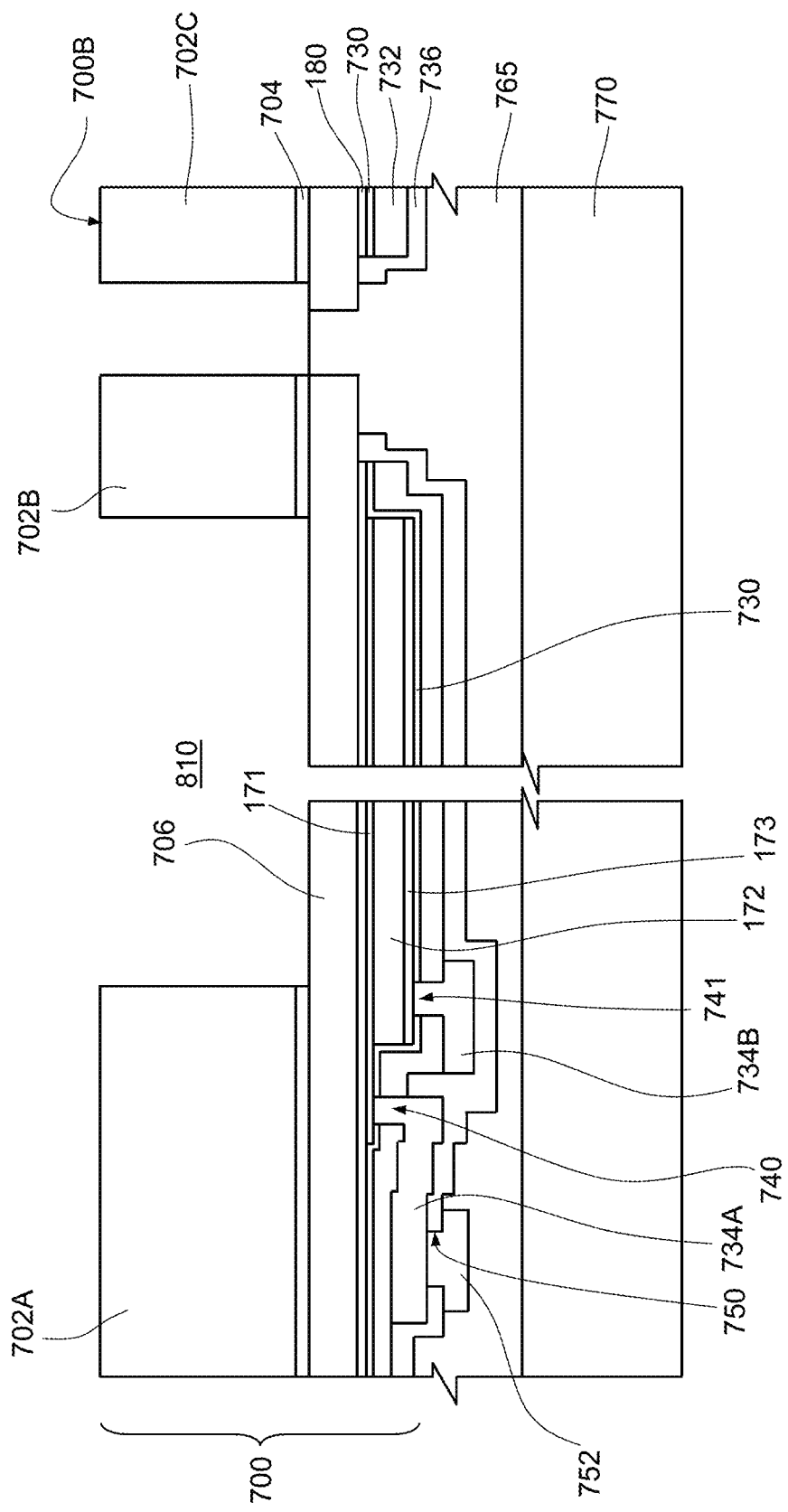

Then, FIG. 15, the second wafer 800 is flipped over and etched from the bottom surface 700B using masking and etching techniques. In particular, the substrate 702 is etched and selectively removed throughout its thickness (for example, using DRIE) so as to form the substrate portions 702A-702C, the cavity 810 and a first part of the trench 755; then, the first insulating layer 704 is etched and selectively removed. In this step, definition of the geometry of the body 101, in particular of the internal portion 102, the connection arms 131, 133, 141, 143, and the frames 104, 108, is completed. The cavity 810 is thus formed and exposes at least in part the membrane layer 706 and the adhesive layer 765.

The adhesive layer 765 is then removed via thermal release techniques (e.g. WaferBOND®, https://www.brewerscience.com/products/waferbond-ht-10-10/) so as to detach the carrier wafer 770 from the first wafer 700. Before or after detachment of the carrier wafer 700, the first wafer 700 is diced, to form a plurality of adjacent bodies 101.

Next, in a way not shown, the wafer 700 is diced to form the MEMS actuator 100 of FIGS. 4-6.

The present MEMS actuator and the manufacturing process thereof have many advantages.

In particular, the body 101 is monolithic and formed in the same structural, semiconductor material region carrying the piezoelectric actuation elements enabling biaxial rotation of the supporting portion 102 (strips 150) and of the optical structures (lens 125). Consequently, the body 101 may be obtained using semiconductor manufacturing techniques, in a simple, inexpensive and reliable way.

The spring elements 106, 107, 110, 111, 306, 307, 310, 311, 506, 507, 510, 511 further enable rotation of the supporting portion 102, 302, 502 (and, therefore, of the lens 125) in a fast and precise way. In fact, actuation of the strips 350 is obtained with low actuation voltages (for example, 40 V); consequently, the power consumption of the MEMS actuator 100, 300, 500 is reduced.

Finally, it is clear that modifications and variations may be made to the MEMS actuator and to the manufacturing process thereof described and illustrated herein, without departing from the scope of the present invention, as defined in the attached claims.

For instance, the torsional arms 620, 621, 630, 631 of FIG. 14 may be also implemented in the embodiment of FIG. 4.

The invention claimed is:

1. A MEMS actuator, comprising:
a monolithic body of semiconductor material including:
a supporting portion of semiconductor material, orientable with respect to a first rotation axis and a second rotation axis, the first rotation axis being transverse to the second rotation axis;
a first frame of semiconductor material, coupled to the supporting portion through first deformable elements configured to control a rotation of the supporting portion about the first rotation axis, wherein the first frame has an elongated hexagonal shape, with two first sides parallel to a first symmetry axis and four end sides extending transverse to the first symmetry axis and a second symmetry axis, wherein the first symmetry axis and the second symmetry axis are parallel to the first and second rotation axis, wherein the first deformable elements extend perpendicularly to the first symmetry axis; and
a second frame of semiconductor material, coupled to the first frame through second deformable elements that are coupled between the first and second frames and configured to control a rotation of the supporting portion about the second rotation axis,
wherein the second frame has a regular quadrangular shape with sides parallel to the end sides of the first frame, wherein the second deformable elements extend parallel to the first symmetry axis; and
wherein the first and second deformable elements carry respective first and second piezoelectric actuation elements.

2. The MEMS actuator according to claim 1, wherein sides of the second frame extend at 45° with respect to the first and second symmetry axes, and the first and second deformable elements extending at 45° with respect to the sides of the second frame.

3. The MEMS actuator according to claim 1, wherein the first and second deformable elements are each formed by first and second elastic elements, the first and second elastic elements of the first deformable elements being arranged on opposite sides of the supporting portion, and the first and second elastic elements of the second deformable elements being arranged on opposite sides of the first frame, the first and second elastic elements having a serpentine shape, wherein the first and second elastic elements of the first deformable elements extend transverse to the first symmetry axis and the first and second elastic elements of the second deformable elements extend transverse to the second symmetry axis.

4. The MEMS actuator according to claim 1, wherein the first and second deformable elements are each formed by first and second elastic elements, the first and second elastic elements of the first deformable elements being arranged on opposite sides of the supporting portion, and the first and second elastic elements of the second deformable elements being arranged on opposite sides of the first frame, the first and second elastic elements having a serpentine shape, wherein the first and second elastic elements of the first deformable elements extend transverse to the first symmetry axis and the first and second elastic elements of the second deformable elements extend transverse to the second symmetry axis.

5. The MEMS actuator according to claim 2, wherein the first and second deformable elements are each formed by first and second elastic elements, the first and second elastic elements of the first deformable elements being arranged on opposite sides of the supporting portion, and the first and second elastic elements of the second deformable elements being arranged on opposite sides of the first frame, the first and second elastic elements having a serpentine shape, wherein the first and second elastic elements of the first deformable elements extend transverse to the first symmetry axis and the first and second elastic elements of the second deformable elements extend transverse to the second symmetry axis.

6. The MEMS actuator according to claim 3, wherein the first and second elastic elements of the first deformable elements comprise:
respective first and second deformable arms, carrying the first piezoelectric actuation elements; and respective first and second connection arms, connecting opposite ends of respective successive first and second deformable arms, thereby forming the serpentine shape.

7. The MEMS actuator according to claim 3, wherein the first and second elastic elements of the second deformable elements comprise:
respective third and fourth deformable arms, carrying the second piezoelectric actuation elements; and
respective third and fourth connection arms, connecting opposite ends of respective successive third and fourth deformable arms, thereby forming the serpentine shape.

8. The MEMS actuator according to claim 3, wherein:
the first and second elastic elements of the first deformable elements are coupled to the supporting portion by respective first ends and to the first frame by respective second ends;
the first and second elastic elements of the second deformable elements are coupled to the first frame by respective first ends and to the second frame by respective second ends;
the first and second ends of the first and second elastic elements of the first deformable elements are symmetrically arranged with respect to the second rotation axis; and
the first and second ends of the first and second elastic elements of the second deformable elements are symmetrical with respect to the first rotation axis.

9. The MEMS actuator according to claim 3, wherein:
the first and second elastic elements of the first deformable elements are coupled to the supporting portion through respective first ends and to the first frame through respective second ends,
the first and second elastic elements of the second deformable elements are coupled to the first frame through respective first ends and to the second frame through respective second ends,
the first and second symmetry axes define a center of the MEMS actuator, and
the first and second ends of the first and second elastic elements of the first and second deformable elements are arranged rotated by 180° with respect to the center.

10. The MEMS actuator according to claim 8, further comprising first and second torsional arms of semiconductor material, wherein the first torsional arms extend between the first elastic elements and the first frame, and wherein the second torsional arms extend between the second elastic elements and the second frame.

11. The MEMS actuator according to claim 10, wherein the first torsional arms extend along the first symmetry axis and the second torsional arms extend along the second symmetry axis.

12. The MEMS actuator according to claim 1, wherein the supporting portion has a first and second larger surfaces and comprises a central opening, the supporting portion supporting a lens.

* * * * *